United States Patent [19]

Merrem et al.

[11] Patent Number: 4,757,098

[45] Date of Patent: Jul. 12, 1988

[54] STABILIZED SOLUTIONS OF RADIATION-CROSSLINKABLE POLYMER PRECURSORS OF HIGHLY HEAT-RESISTANT POLYMERS

[75] Inventors: Hans J. Merrem, Seeheim; Rudolf Klug, Aschaffenburg; Horst Binder, Lampertheim, all of Fed. Rep. of Germany

[73] Assignee: Merck Patent Gesellschaft mit Beschrankter Haftung, Darmstadt, Fed. Rep. of Germany

[21] Appl. No.: 853,102

[22] Filed: Apr. 17, 1986

[30] Foreign Application Priority Data

Apr. 17, 1985 [DE] Fed. Rep. of Germany ....... 3513779

[51] Int. Cl.$^4$ ............................................... G03C 1/71
[52] U.S. Cl. ........................................ 522/75; 522/78; 522/174; 430/283; 528/289; 524/87; 524/239; 524/251; 524/555
[58] Field of Search ......................... 524/239, 87, 251; 522/14, 16, 78, 75, 174; 528/289

[56] References Cited

U.S. PATENT DOCUMENTS

| Re. 30,186 | 1/1980 | Rubner | 430/325 |
|---|---|---|---|
| 2,667,522 | 11/1954 | McElroy | 524/239 |
| 4,129,486 | 12/1978 | Deutsch | 522/14 |
| 4,204,928 | 5/1980 | Via | 522/16 |
| 4,222,835 | 9/1980 | Dixon | 522/14 |
| 4,414,312 | 11/1983 | Goff | 522/14 |
| 4,416,973 | 11/1983 | Goff | 522/14 |
| 4,430,418 | 2/1984 | Goff | 522/14 |
| 4,481,280 | 11/1984 | Fujikawa | 522/14 |
| 4,483,758 | 11/1984 | Rowe | 522/14 |
| 4,539,288 | 9/1985 | Merrem et al. | 430/325 |
| 4,540,650 | 9/1985 | Klug et al. | 430/281 |
| 4,701,300 | 10/1987 | Merrem | 430/283 |

FOREIGN PATENT DOCUMENTS 2437348 2/1976 Fed. Rep. of Germany .
3227584 1/1984 Fed. Rep. of Germany .

OTHER PUBLICATIONS

Grant, *Hackh's Chemical Dictionary* (4th edition), p. 428; McGraw-Hill, NY, 1972.
Roffey, *Photo Polymerization of Surface Coatings*, pp. 88-89, Wiley-Interscience, Jun. 1982.
Martell & Calvin, *Chemistry of the Metal Chelate Compounds*, Prentice Hall Inc. (1952), p. 10.
Mullins et al, "Radiation Crosslinking of Rubber. III Chain Fracture", Journal of Polymer Science, vol. XLIII, pp. 35-47 (1960).

*Primary Examiner*—C. Warren Ivy
*Attorney, Agent, or Firm*—Millen & White

[57] ABSTRACT

Stabilized solutions of radiation-crosslinkable polymer precursors of highly heat-resistant polymers, containing chelate complex-formers as stabilizers, do not tend to gel through premature crosslinking and can thus be stored and used over a long period.

17 Claims, No Drawings

STABILIZED SOLUTIONS OF RADIATION-CROSSLINKABLE POLYMER PRECURSORS OF HIGHLY HEAT-RESISTANT POLYMERS

BACKGROUND OF THE INVENTION

The invention relates to stabilized solutions of radiation-crosslinkable polymer precursors of highly heat-resistant polymers.

The polymer precursors involved here are soluble polyaddition or polycondensation products formed from carbocyclic or heterocyclic compounds having two functional groups capable of polyaddition or polycondensation reactions and having radiation-reactive radicals in part attached in the ortho-position or pera-position relative to these groups by an ester linkage to carboxyl groups, and diamines, diisocyanates, bis-acid chlorides or dicarboxylic acids which are capable of reacting with these functional groups and which contain at least one cyclic structural element. The multifarious radiation-reactive radicals which can be present in these soluble polymeric precursors are disclosed, for example, in the following patent specifications: German Patent Specification No. 2,308,830/U.S. Pat. No. 3,975,512, German patent specification No. 2,437,348/U.S. Pat. No. Re. 39,186, German patent specification No. 2,437,368/U.S. Pat. No. 4,045,223 and German patent specification No. 2,437,422/U.S. Pat. No. 4,088,489 and in German patent applications, German Offenlegungsschriften Nos. 3,227,584 and 3,233,912, equivalent to U.S. Pat. No. 4,540,650, all of which disclosures are incorporated by reference herein.

As a rule, these are radiation-crosslinkable unsaturated groups containing vinyl or allyl double bonds. In particular, they are hydroxyallyl, hydroxyalkyl acrylate and hydroxyalkyl methacrylate groups which are attached by an ester linkage to carboxyl groups, such as, for instance, 2-hydroxyethyl acrylate or methacrylate groups, and also ester groups containing allyloxy and/or allylthio groups.

These radiation-crosslinkable polymer precursors which are readily soluble in a large number of organic solvents can be processed very advantageously to give photosensitive resist lacquers which are used to a large extent in the production of electrical and electronic components, for instance as photoresists or in the form of insulation or protective layers in the manufacture of semiconductors, or for the production of orientation layers in the manufacture of liquid-crystal displays or in the production of etch resists and plating resists and of printing plates. This is effected by applying photosensitive resist lacquers of this type to appropriate substrates in the form of a layer, drying the layer and then exposing it imagewise completely or through a negative original. As the result of this, a crosslinking takes place at the irradiated areas, which drastically reduces the solubility of the applied material at these areas. Non-irradiated parts of the layer can then be detached from the substrate by means of a developer; the remaining parts of the layer or relief structures can be converted by heat treatment into highly heat-resistant polymers which withstand temperatures of 250°–400° C. without a disadvantageous effect on the coating or the sharpness of contours and resolution of the image pattern.

It is known, however, that solutions of these polymer precursors, such as can be present for the above-mentioned purposes, for instance in the form of photosensitive resist lacquers, have a tendency towards spontaneous, non-reproducible and also irreversible increases in viscosity. These solutions frequently gel in the course of only a few days, sometimes only in the course of several weeks, and are then no longer suitable for further use. By virtue of this spontaneous, unpredictable and uncontrolled behavior, photosensitive resist lacquers based on these polymer precursors are scarcely capable of storage and use or, if so, only a conditional basis. It can be assumed that these viscosity changes are brought about by spontaneous, non-photoinduced crosslinking of the unsaturated, radiation-reactive groups of the polymer precursors.

It has been found that the polymerization inhibitors with which those skilled in the art are familiar for stabilizing acrylic, vinyl and allyl compounds, such as, for example, hydroquinone or, for instance, heavy metals such as copper, effect an inadequate stabilization, or none at all, in the case of the present radiation-crosslinkable polymer precursors, or are even completely unsuitable for use in photosensitive resist lacquers for the manufacture of semiconductors.

SUMMARY OF THE INVENTION

It is therefore an object to provide solutions of these radiation-crosslinkable polymer precursors of highly heat-resistant polymers that are stabilized against gelling through premature crosslinking. It is an additional object to provide stabilized lacquers for the preparation of photoresists, and to provide photoresists prepared therefrom.

Upon further study of the specification and appended claims, further objects and advantages of this invention will become apparent to those skilled in the art.

Surprisingly, it has now been found that an effective stabilization of solutions of radiation-crosslinkable polymer precursors of highly heat-resistant polymers against gelling through premature crosslinking is achieved if chelate complex-formers are added to these solutions as stabilizers.

The objects are therefore achieved by providing stabilized solutions of radiation-crosslinkable polymer precursors of highly heat-resistant polymers, which contain chelate complex-formers as stabilizers, and by providing photosensitive resist lacquers based on radiation-crosslinkable polymer precursors of highly heat-resistant polymers, said lacquers containing chelate complex-formers as stabilizers The objects are also achieved by the provision of a method for stabilizing solutions of radiation-crosslinkable polymer precursors of highly heat-resistant polymers against gelling through premature crosslinking by the inclusion of chelate complex formers.

DETAILED DISCUSSION

The chelate complex-formers to be added, in accordance with the invention, as stabilizers to the solutions of radiation-crosslinkable polymer precursors, are known per se, for instance from the field of analytical chemistry, in particular complexometry. Any bidentate or multidentate chelate complex-former capable of forming stable chelate complexes with metal ions is suitable for the purposes of the invention. Metal ions that are complexed by said chelate complex-former are, e.g., those of lead, copper, nickel, iron, aluminium, manganese, magnesium, zinc and calcium. Preferable complex-formers are ethylenediamine, nitrilotriacetic acid, ethylenediaminetetraacetic acid, 1,2-cyclohexylenediaminetetraacetic acid, diethylenetriaminepentaacetic acid, bis-(2-aminoethyl)-glycol-ether-N,N,N',N'-tetraacetic acid and 8-hydroxyquinoline, all of which are readily commercially available. Ethylenediaminetetraacetic acid and 8-hydroxyquinoline are particularly preferred. See, e.g., Stary: Chelating Extractans, Oxford, Pergamon 1978; Bell: Principles and Applications of Metal Chelation, London, Oxford Univ. Press. 1977, which are incorporated by reference herein.

The solutions of photo-crosslinkable polymer precursors of highly heat-resistant polymers are stabilized extremely effectively by these chelate complex-formers against a spontaneous, non-photoinduced crosslinking. Solutions of this type exhibit, over a period of weeks, no tendency at all towards uncontrolled viscosity changes and can thus be stored for any desired time, and subsequently used, for instance, in the form of photosensitive resist lacquers. Furthermore, these stabilizers exert no harmful effect on the later photo-crosslinking of coatings prepared using such photosensitive resist lacquers, for example, photoresist relief structures in the manufacture of semiconductors. There is no need to apply specifically controlled storage conditions to achieve the atabilizing effect of the invention. Storage at ambient temperature is preferred.

The amount of the stabilizers according to the invention to be added to the polymer solutions may vary within wide limits and is not critical. Even small amounts, for instance within the range of 0.1–100 ppm, are adequate for effective inhibition of gelling. It is preferable to add the chelate complex-formers to the solutions of photo-crosslinkable polymer precursors in a proportion of 10–50 ppm, relative to the polymer solutions. The preparation of solutions of this type, stabilized in accordance with the invention, is effected by merely adding a suitable amount of the appropriate complex-former to the polymer solutions in a solvent. Chelating agents which are soluble in the polymer precursors are preferred. To facilitate the solution process use of micronized forma of the chelating agents, stirring and application of ultrasonic irradiation are useful. The temperature applied during the solution process is not critical; ambient temperature is preferred. The preparation of the polymer solutions or photosensitive resist lacquers, per se, from polymer precursors is effected in an entirely conventional manner, for instance as indicated in the publications quoted initially as examples, and incorporated by reference above.

Examples of suitable solvents capable of dissolving the soluble polymeric precursors and the other constituents of the photosensitive resist lacquers are ethylene glycol, glycol ethers, such as glycol monomethyl ether, glycol dimethyl ether and glycol monoethyl ether; aliphatic esters, such as ethyl acetate, hydroxyethyl acetate, alkoxyethyl acetate, n-butyl acetate or amyl acetate; ethers, such as dioxane; ketones, such as methyl ethyl ketone, methyl isobutyl ketone, cyclopentanone and cyclohexanone; dimethylformamide, dimethylacetamide, hexamethylphosphoric acid triamide, N-methylpyrrolidone, butyrolactone, tetrahydrofuran and mixtures of such solvents. In photo-sensitive resist lacquers, these solutions contain, as a rule, 1 to 60%, preferably 5 to 50%, of solids.

In principle, all polymer precursors of highly heat-resistant polymers which are soluble in organic solvents and which carry unsaturated, radiation-reactive groups can be stabilized in accordance with the invention against premature crosslinking. The effect of the stabilizers in inhibiting spontaneous crosslinking is independent of the particular nature of the polymer base substance, since crosslinking takes place via the unsaturated, radiation-reactive groups.

The invention is principally directed towards the stabilization of the polymer precursors such as are disclosed in the publications quoted initially. Polymeric precursors which are preferred among these are polycondensates formed from pyromellitic acid carrying two radiation-reactive radicals attached by an ester linkage to carboxyl groups, and from a diamine containing at least one cyclic structural element, such as, for example, 4,4'-diaminodiphenyl ether, 4,4'-diaminodiphenylmethane, 4,4'-diaminodiphenyl sulfone and 2,4-diaminopyridine. Polycondensates which are particularly preferred are those formed from pyromellitic acid containing two carboxyl groups esterified with 2-hydroxyethyl methacrylate and/or with glycol monoallyl ether (in accordance with German patent specification No. 2,437,348 or German Offenlegungsschrift No. 3,227,584) together with 4,4'-diaminodiphenyl ether. Furthermore, it is possible to stabilize in accordance with the invention any photosensitive resist lacquers prepared in a customary manner from such polymer precursors. The choice of solvent and the presence of additives and auxiliaries which are customary in the technology of photosensitive resist lacquers, in particular substances which increase the sensitivity of the resist lacquers to radiation, such as copolymerizable monomers, photosensitizers and photoinitiators, have no effect on the stabilizing action of the chelate complex-formers.

The use of the photosensitive resist lacquers which have been stabilized in accordance with the invention, for example in the manufacture of semiconductors, is effected in a manner entirely analogous to that known from photosensitive resist lacquers according to the state of the art as known from W. S. De Forest: Photoresists. Materials and Processes. McGraw-Hill, N.Y. 1975.

It is thus possible, in accordance with the invention, to offer to the trade photosensitive resist lacquers which are particularly high-grade with respect to quality and which remain storable and usable for a long period through the addition of chelate complex-formers as stabilizers.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the preceding text and the following examples, all temperatures are set forth uncorrected in degrees Celsius and all parts and percentages are by weight; unless otherwise indicated.

EXAMPLES

EXAMPLE 1

Radiation-crosslinkable Polymeric Precursor

A radiation-crosslinkable, polymeric precursor is obtained, in accordance with German patent specification No. 2,437,348, (U.S. Pat. No. Re. 30,186) by reacting pyromellitic dianhydride with 2-hydroxyethyl methacrylate and subsequently subjecting the product to a condensation reaction with 4,4'-diaminodiphenyl ether in the presence of thionyl chloride.

EXAMPLE 2

The Viscosity Behavior of Solutions When Stored at +4° C.

8 solutions each containing about 45% by weight of a polymeric precursors according to Example 1 in N-methylpyrrolidone were prepared. 50 ppm of a chelate complex-former were added to each of 4 of the test solutions; the others received no stabilizer. The viscosities of the solutions were determined and were measured again after being stored for 14 days at a temperature of +4° C.

| Sample | | Initial Viscosity (mm²/second) | Viscosity after 14 days (mm²/second) | Increase % |
|---|---|---|---|---|
| 1 | with ethylenediaminetetraacetic acid as stabilizer | 2659 | 2659 | 0 |
| 2 | with ethylenediaminetetraacetic acid as stabilizer | 2727 | 2741 | 0.5 |
| 3 | with ethylenediaminetetraacetic acid as stabilizer | 2812 | 2812 | 0 |
| 4 | with ethylenediaminetetraacetic acid as stabilizer | 2914 | 2925 | 0.4 |
| 5 | without stabilizer | 2644 | 2910 | 10.0 |
| 6 | " | 2617 | 3005 | 14.8 |
| 7 | " | 2639 | 2995 | 13.5 |
| 8 | " | 2747 | 3595 | 30.8 |

Within the limits of accuracy, the viscosities of the solutions to which the complex-former had been added remained unchanged. The unstabilized solutions, however, exhibited increases of 10 to 30% in viscosity.

EXAMPLE 3

Gelling Test at a Storage Temperature of 42° C.

50 ppm of the chelate complex-former ethylenediamine tetraacetic acid were added to 55 samples of a 45% strength by weight solution of a polymeric precursor according to Example 1, and these samples were stored at a temperature of 42° C., together with 17 comparison samples without stabilizer.

After 3 to 8 days, all the 17 comparison samples had gelled. Even after 40 days, the 55 stabilized samples exhibited no change.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a composition comprising a radiation-crosslinkable polyamide ester polymer precursor of a highly heat-resistant polyimide polymer, the improvement wherein the composition further comprises an amount of a chelating agent effective to stabilize the precursor against non-photoinduced crosslinking, said chelating agent being ethylenediamine, nitrilotriacetic acid, ethylenediamine-tetraacetic acid, 1,2-cyclohexylenediaminetetraacetic acid, diethylenetriaminepentaacetic acid, bis-(2-aminoethyl)-glycol-ether-N,N,N',N'-tetraacetic acid or 8-hydroxyquinoline.

2. A composition according claim 1, wherein the chelating agent is ethylenediaminetetraacetic acid or 8-hydroxyquinoline.

3. A composition according to claim 1, wherein the effective amount of chelating agent is 0.1–100 ppm based on the polymer precursor.

4. A composition according to claim 1, wherein the effective amount of chelating agent is 10–50 ppm based on the polymer precursor solution.

5. A composition according to claim 1, wherein the radiation-crosslinkable polymer precursor is a polycondensate of pyromellitic acid having two radiation-reactive radicals each attached by an ester linkage to a carboxyl group and of a diamine containing at least one cyclic group.

6. A composition according to claim 5, wherein the diamine is 4,4'-diaminodiphenyl ether, 4,4'-diaminodiphenylmethane, 4,4'-diaminoediphenyl sulfone or 2,4-diaminopyridine.

7. A composition according to claim 5, wherein the polycondensate is a polycondensate of pyromellitic acid, containing two carboxy groups esterified with 2-hydroxyethyl methacrylate, and of 4,4'-diaminodiphenyl ether.

8. A composition according to claim 5, wherein the polycondensate is a polycondensate of pyromellitic acid, containing two carboxy groups esterified with glycol monoallyl ether.

9. A composition according to claim 1, wherein the radiation-crosslinkable polymer precursor is a polycondensate of pyromellitic acid having two radiation-reactive radicals each attached by an ester linkage to a carboxyl group and of a diamine containing at least one cyclic group.

10. A composition according to claim 2, wherein the radiation-crosslinkable polymer precursor is a polycondensate of pyromellitic acid having two radiation-reactive radicals each attached by an ester linkage to a carboxyl group and of a diamine containing at least one cyclic group.

11. In a photosensitive resist lacquer based on a radiation-crosslinkable polymer precursor, the improvement wherein the precursor is one of claim 1.

12. A composition of claim 1, which is a photosensitive resist lacquer.

13. A composition of claim 2, which is a photosensitive resist lacquer.

14. A method of increasing the stability of viscosity level over time of a solution of a radiation-crosslinkable polyamide ester polymer precursor of a highly heat-resistant polyimide polymer, comprising adding a stabilization effective amount of a chelating agent which is a bidentate or multidentate chelate complex-former capable of forming a stable complex with a metal ion.

15. A method of preventing or lessening the amount of non-photoinduced crosslinking in a solution of a radiation-crosslinkable polyamide ester polymer precursor of a highly heat-resistant polyimide polymer, comprising adding a stabilization effective amount of a chelating agent which is a bidentate of multidentate chelate complex-former capable of forming a stable complex with a metal ion.

16. A composition according to claim 1 wherein the chelating agent is ethylenediamine, nitrilotriacetic acid, ethylenediaminetetraacetic acid, 1,2-cyclohexylenediaminetetraacetic acid, diethylenetriaminepentaacetic acid, or bis-(2-aminoethyl)-glycol-ether-N,N,N',N'-tetraacetic acid.

17. A composition according to claim 1, wherein the chelating agent is a bidentate chelate complex former.

* * * * *